(12) United States Patent
Patel et al.

(10) Patent No.: US 7,174,013 B1
(45) Date of Patent: Feb. 6, 2007

(54) EFFICIENT UNIVERSAL HASHING METHOD

(75) Inventors: Sarvar Patel, Montville, NJ (US); Zulfikar Amin Ramzan, Boston, MA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/175,178

(22) Filed: Oct. 20, 1998

(51) Int. Cl.
*H04K 1/08* (2006.01)
*H04K 1/02* (2006.01)
*H04K 1/06* (2006.01)

(52) U.S. Cl. .......................... 380/28; 380/268; 380/270
(58) Field of Classification Search .................. 380/28, 380/29
See application file for complete search history.

(56) References Cited

U.S. PATENT DOCUMENTS

| 5,442,699 A | * | 8/1995 | Arnold et al. ................. 380/1 |
| 5,625,693 A | * | 4/1997 | Rohatgi et al. ............. 380/212 |
| 6,122,375 A | * | 9/2000 | Takaragi et al. .............. 380/37 |

OTHER PUBLICATIONS

Scneier, Applied Cryptography, 1996, Wiley and Sons, 2nd edition, pp. 457, 458.*
A.R. Meijer, Hash Functions Based on Modular Squaring, Transactions of the S.A. Institute of Electrical Engineers, Jun. 1995.*
Bellare and Micciacio, Hashing by Adding, section 5, A New Paradigm for Collision Free Hashing: Incrementality at Reduced Cost, Nov. 1996, Advances in Cryptology, Eurocrypt 97 Proceedings.*
Schneier, Bruce. "One Way Hash Functions." Message Authentication Codes. New York, NY: John Wiley & Sons, Inc, 1996. 457-458.*
EPO International Search Report, EP 99 30 8032, dated Mar. 29, 2004.
Etzel et al., "*Square Hash: Fast Message Authentication Via Optimized Universal Hash Function,*" XP-002271715, dated.
S. Halevi and H. Krawczyk, "*MMH: Message Authentication I the Gbit/second Rates,*" XP-002271714 in Proceedings of the 4th Workshop on Fast Software Encryption, Lecture Notes in Computer Science, Springer-Verlag, Mar. 1997.
Jueneman et al., "*Message Authentication,*" IEEE Communications Magazine, Sep. 1985—vol. 23, No. 9, pp. 29-40.
Preneel et al., "*Cryptographic Hash Functions,*" European Transactions on Telecommunications and Related Technologies, XP 000460559, Jul. 1994.
Girault, Marc, "*Hash-Functions Using Modulo-n Operations,*" Advances in Cryptology, Eurocrypt '87, LNCS. 304, pp. 217-226, 1988.
Knuth, D.E.: "*The Art of Computer Programming,*" vol. 2: Seminumerical Algorithms 1980, Addison Wesley, Reading, Massachusetts, USA XP 002271716, 2nd Edition, pp. 10-11, & 26-27.

\* cited by examiner

*Primary Examiner*—Gilberto Barrón, Jr.
*Assistant Examiner*—Venkat Perungavoor

(57) ABSTRACT

An efficient hashing technique uses $$\frac{w^2 + w}{2}$$

operations to hash a string "w" words long rather than the $w^2$ operations of the prior art. This efficiency is achieved by squaring the sum of the key and the string to be hashed rather than forming a product of the key and the string to be hashed $$h(m) = ((m+a)^2 \bmod p) \bmod 2^l.$$

3 Claims, 3 Drawing Sheets

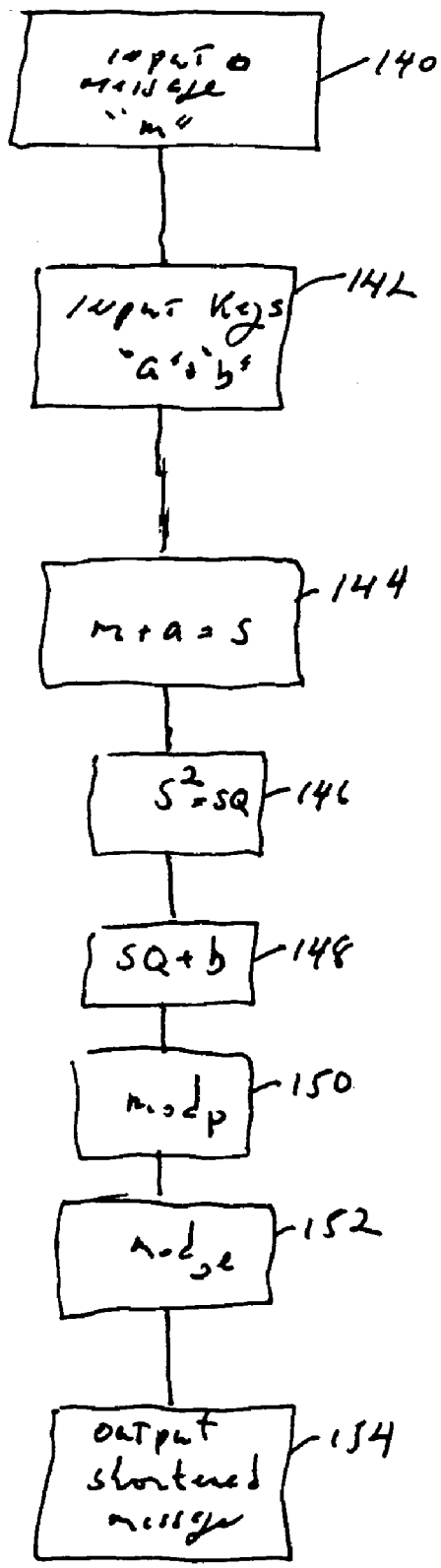

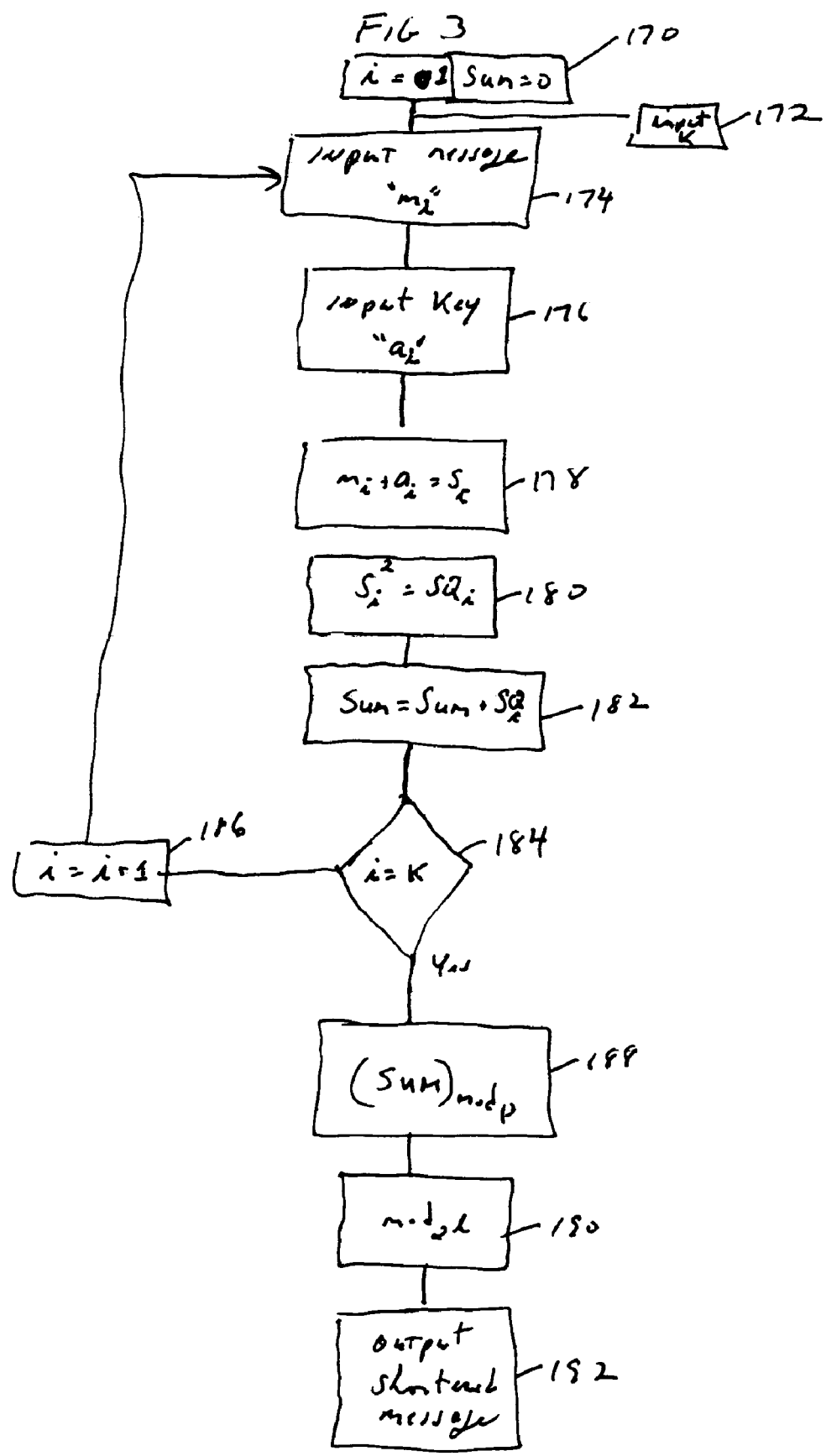

EFFICIENT UNIVERSAL HASHING METHOD

BACKGROUND OF THE INVENTION

1. Field of the Invention

The present invention relates to data manipulation; more specifically, the invention relates to an efficient technique for representing long strings of data as shorter strings of data.

2. Description of the Related Art

Hashing is a technique for representing longer lengths of data as shorter lengths of data. The techniques are such that there is a relatively small probability that two different longer lengths of data will be represented as identical short lengths of data. The feature is called a probability of collision.

$$Pr(h(m_1) = h(m_2)) \leq \varepsilon \qquad (1)$$

$$\varepsilon \geq \frac{1}{2^l}$$

The probability of collision is represented by Equation (1) which indicates that the probability of a hashing function "h" performed on a string $m_1$ being equal to the result of a hashing function "h" performed on a string $m_2$ being less than or equal to $$\frac{1}{2^l} \text{ or } \varepsilon.$$

The number of bits contained in the longer unhashed string is "n". The number of bits in the shorter or hashed string is "l". A hashing function that satisfies Equation (1) is often referred to as $\varepsilon$ universal.

$$Pr(h(m_1) = h(m_2) = \Delta) \leq \varepsilon \qquad (2)$$

$$\varepsilon \geq \frac{1}{2^l}$$

Another property typically associated with hashing functions is represented by Equation (2) where it indicates that the probability of the difference between the output of a hashing function "h" on string $x_1$ and the output of a hashing function on string $x_2$ being equal to some preselected number $\Delta$ is less than or equal to $$\frac{1}{2^l}$$

or $\varepsilon$. Hashing functions that satisfy Equation (2) are typically referred to as $\varepsilon\Delta$ universal hash functions.

$$Pr(h(m_1) = c_1, h(m_2) = c_2) \leq \frac{\varepsilon}{2^l} \qquad (3)$$

$$\varepsilon \geq \frac{1}{2^l}$$

Some hash functions also have a third property illustrated by Equation (3). Equation (3) shows that the joint probability of the output of hashing function "h" for input string $x_1$ being equal to a predetermined number $c_1$ and the output of hashing function "h" for input string $x_2$ being equal to predetermined number $c_2$ is less than $$\frac{1}{2^l}$$

or $\varepsilon$. A hashing function that satisfies Equation (3) is referred to as $\varepsilon$ strongly universal. Hashing functions that satisfy Equation (3) automatically satisfy Equations (1) and (2).

Hashing functions are used in many applications, one of which is to simplify searching for text strings. When used for searching for text strings, the hashing function is used to reduce the size of the stored information and then the same hashing function is used to reduce the size of the search criteria. The shortened search criteria is then used to search for the shortened stored information to more efficiently locate a desired piece of information. Once the desired piece of information has been located, the unhashed or full length text associated with the shorted text can be provided.

Hashing functions are also used in wireless communications for message authentication. A message is authenticated by sending a message string along with a tag, calculated by performing a cryptographic function on the message. Forming a tag of a message string is computationally intensive. Hash functions are used to shorten the message to a tag so that the cryptographic processing required is less intense.

$$h(m) = (ma) \bmod p \qquad (4)$$

$$h(m_1, \ldots, m_k) = \left(\sum_{i=1}^{K} m_i a_i\right) \bmod p \qquad (5)$$

Techniques such as linear hashing illustrated by Equation (4) and MMH hashing illustrated by Equation (5) are now used to represent longer strings of data or text as shorter strings where the probability of two different long strings producing the same short string is relatively small. These hashing functions require a multiplication of a key that is "w" words long by a "w" words long message or text that is to be hashed. As a result, $w^2$ operations are required to perform a hashing of a particular string of data or text. For large strings of data or text having many words, this results in a computationally intensive operation.

SUMMARY OF THE INVENTION

The present invention provides an efficient hashing technique that uses $$\frac{w^2 + w}{2}.$$

operations to hash a string "w" words long rather than the $w^2$ operations of the prior art. The present invention achieves this efficiency by squaring the sum of the key and the string to be hashed rather than forming a product of the key and the string to be hashed.

$$h(m) = ((m+a)^2 \bmod p) \bmod 2^l \qquad (6)$$

In one embodiment of the invention, as illustrated by Equation (6), a hashing of a message "m" is performed by summing the message string with a key string "a" and then forming the square of that summation. A modular "p" operation performed on the result of the squaring operation and a modular $2^l$ operation is performed on the result of the modular "p" operation. In this case, both "m" and "a" are of the same length, that is, "n" bits or "w" words long. It should be noted that "a" may be longer than "n" bits, but "n" bits is preferable. The value "l" refers to the length in bits of the shortened string that results from the hashing. The value "p" is selected as the first prime number greater than $2^n$ where "n" is the number of bits in the message string "m". It should be noted that Equation (6) provides a hashing method that satisfies Equations (1) and (2), that is, the hashing method of Equation is $\Delta$ universal.

$$h(m)=(((m+a)^2+b)\bmod p)\bmod 2^l \tag{7}$$

In the second embodiment of the present invention, a strongly universal hashing method is provided. In this case, message string "m" is summed with key "a" and then the resulting sum is squared. Both message string "m" and key "a" are "w" words long containing a total of "n" bits. It should be noted that key "a" may contain more than "n" bits, but "n" is preferable. The result of the squaring operation is then summed with a second key "b" which is at least "n" bits long. A modular "p" operation is performed on the sum of the squared term and key "b" as discussed above with regard to Equation (6). A modular $2^l$ operation is performed on the result of the modular "p" operations as was described with regard to Equation (6). Using this hashing method provides a strongly universal hashing method that satisfies Equation (1), (2) and (3).

In yet another embodiment of the present invention, "k" messages or strings are hashed so that a single shorter string is produced.

$$h(m_1, \ldots, m_k) = \left(\left(\sum_{i=1}^{K} (m_i + a_i)^2\right) \bmod p\right) \bmod 2^l \tag{8}$$

Equation (8) illustrates the hashing function where "k" messages, each of which is "w" words long are hashed to form a single shorter string. Each message $m_i$ is summed with a key $a_i$ and the resulting sum is squared. The result of the squaring operation for each message $m_i$ is then summed over the "k" messages. A modular "p" operation is performed on the overall sum, and a modular $2^l$ operation is performed on the result of the modular "p" operation. The values "p" and "l" are once again defined as described above. The hashing method illustrated by Equation (8) produces a $\Delta$ universal hashing function that satisfies Equations (1) and (2).

BRIEF DESCRIPTION OF THE DRAWING

FIG. 2 is a flowchart of a strongly universal square hashing method; and

FIG. 3 is a flowchart of a second $\Delta$ universal square hashing method.

DETAILED DESCRIPTION

Figure 1:
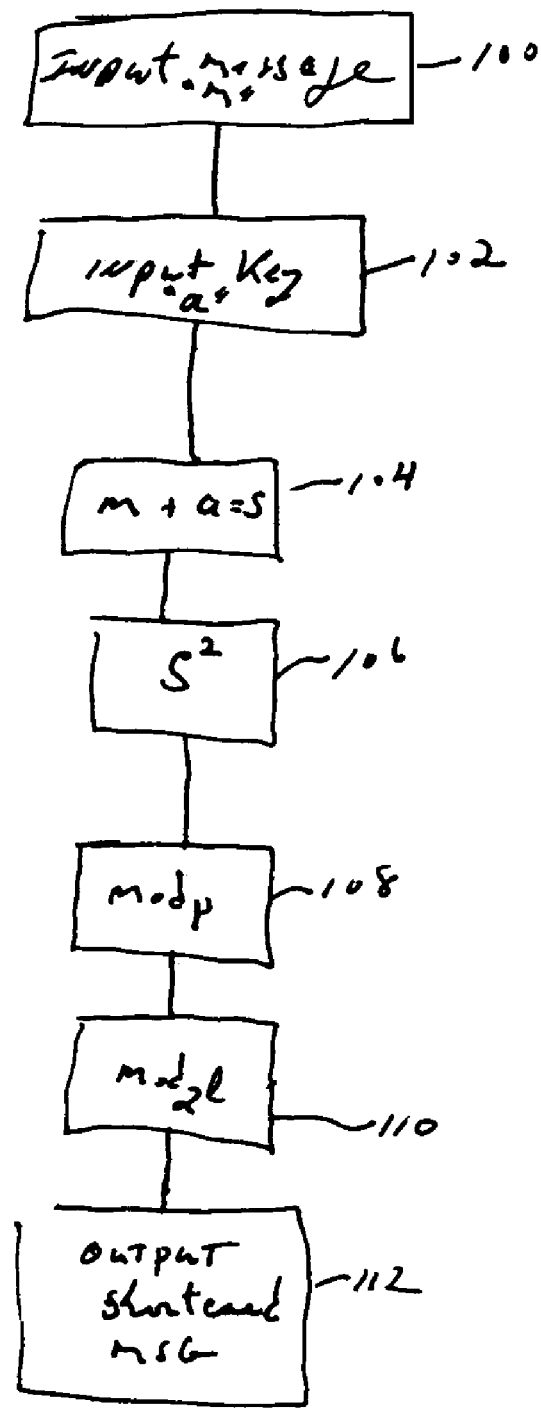
FIG. 1 is a flowchart of a square hashing method.

FIG. 1 illustrates a method for carrying out the square hashing method of Equation (6). In step 100 an input string or message "m" is inputted. In step 102 an input key "a" is inputted. The message or string "m" and the key "a" are each "n" bits long consisting of "w" words. Key "a" is a random or pseudo-random number and may be longer than "n" bits, but "n" bits is preferable. In step 104 the sum "s" of string "m" and key "a" is formed. In step 106 sum "s" is squared. In step 108 a modular "p" operation is formed on the result of step 106. "p" is the next prime number larger than $2^n$; however, "p" may be a larger prime which may degrade performance. In step 110 a modular $2^l$ operation is performed on the result of step 108. "l" is the number of bits in the short output message or string. In step 112 the result of the modular $2^l$ operation is outputted. The process of FIG. 1 results in a message or string of "n" bits being reduced to a message or string of "l" bits. It should be noted that the process associated with FIG. 1 executes an $\epsilon\Delta$ universal hash function that satisfies the properties of Equations (1) and (2).

FIG. 2 illustrates a method for carrying out the strongly universal hashing method described by Equation (7). In step 140 a message or string "m" is inputted. In step 142 keys "a" and "b" are inputted. Message "m", key "a" and key "b" are each "n" bits long having "w" words. In step 144 the sum of message "m" and key "a" is formed and stored as sum "s". In step 146 the square of sum "s" is stored as term "SQ". In step 148 the sum of the term "SQ" and key "b" is formed. In step 150 a modular "p" operation is performed on the result produced by step 148. Once again, "p" is equal to the next prime number greater than $2^n$; however, "p" may be a larger prime which may degrade performance. In step 152 a modular $2^l$ operation is performed on the result from step 150. "l" is equal to the number of bits in the string or message to be outputted by this method. In step 154 the short message or string of length "l" is outputted. It should be noted that the method of FIG. 2 reduced a string or message of "n" bits to a string or message of "l" bits. It should also be noted that the process of FIG. 2 is an $\epsilon$ strongly universal hash function that satisfies the properties of Equations (1), (2) and (3).

FIG. 3 illustrates a method for performing the $\epsilon\Delta$ universal hashing method described by Equation (8). In step 170 index "i" is set equal to 1 and the variable SUM is set equal to 0. In step 172 the value of "k" is inputted. "k" is equal to the number of strings or messages that will be inputted to produce a single shortened message. In step 174 message or string $m_i$ is separated, and in step 176 input key $a_i$ is inputted. It should be noted that message or string $m_i$ and input key $a_i$ are of equal length and have "n" bits composing "w" words. Key "$a_i$" is a random or pseudo-random number and may be longer than "n" bits, but "n" bits is preferable. Preferably, $a_i$ is a random number. Random numbers can be generated from many sources such as pseudo-random generators. In step 178 sum $s_i$ is formed by forming the sum of message $m_i$ and key $a_i$. In step 180 the square of $s_i$ is set equal to variable $SQ_i$. In step 182 the variable SUM is set equal to the variable SUM plus $SQ_i$. In step 184 the value of "i" is checked to determine if it is equal to the value "k". If it is not equal to the value "k", step 186 is executed where the value of index "i" is incremented by "1" and then step 174 is executed. If in step 184 the value of "i" is determined to be equal to "k", step 188 is executed where a modular "p" operation is performed on the current value of the variable SUM. As discussed previously, the value "p" is the next prime number greater than the value $2^n$; however, "p" may be a larger prime which may degrade performance. In step 190 a modular $2^l$ operation is performed on the results produced in step 188. Once again, "l" is the number of bits composing the output string or message. In step 192 the shortened message or string of "l" bits is outputted. It should be noted that the process of FIG. 3 reduced "k" messages of "n" bits each to one message of "l" bits. It should also be noted that the hashing method of FIG. 3 is a $\epsilon\Delta$ universal hashing method that satisfies the properties of Equations (1) and (2).

In reference to FIGS. 1, 2 and 3, it should be noted that the value "l" is typically chosen based on a trade-off between desiring a short output message of length "l" and the desire to minimize the probabilities of Equations (1) and (2) and in the case of an $\epsilon$ strongly universal hash function, Equation (3).

The following section provides an abbreviated proof showing that the disclosed squaring hash functions satisfies the properties for Equations (1), (2) and (3).

Theorem 1: The hashing function described by Equation (6) is $\Delta$—universal.

Proof: For all $m \neq n \epsilon Z_p$, and $\Delta \epsilon Z_p$:

$$P_x r[h_x(m) - h_x(n) = \Delta] \quad (1)$$

$$= P_x r[(m+x)^2 - (n+x)^2 = \Delta] \quad (2)$$

$$= P_x r[m^2 - n^2 + 2(m-n)x = \Delta] \quad (3)$$

$$= 1/p \quad (4)$$

Where the last inequality follows since for any given $m \neq n \epsilon Z_p$ and $\delta \epsilon Z_p$ there is a unique x which satisfies the equation $m^2 - n^2 + 2(m-n)x = \delta$.

Theorem 2: The hashing function described by Equation (7) is a strongly universal family of hash functions.

Proof: Follows as an immediate corollary of the following lemma which shows how to convert any $\Delta$—universal family of hash functions into a strongly—universal family of hash functions.

Lemma 1: Let "h"={$h_x$: D→R|x$\epsilon$K}, where R is an abelian group and "k" is the set of keys, be a $\Delta$—universal family of hash functions. Then H'={$h'_{x,b}$: D→R|x$\epsilon$K,b$\epsilon$R} defined by $h'_{x,b}(m) \equiv (h_x(m)+b)$ (where the addition is the operation under the group R) is a strongly universal family of hash functions.

Proof: For all $m \neq n \epsilon D$ and all $\alpha, \beta \epsilon R$:

$$\Pr_{x,b}[h'_{x,b}(m) = \alpha, h'_{x,b}(n) = \beta] \quad (5)$$

$$= \Pr_{x,b}[h_x(m) + b = \alpha, h_x(n) + b = \beta] \quad (6)$$

$$= \Pr_{x,b}[h_x(m) - h_x(n) = \alpha - \beta, b = \alpha - h_x(m)] \quad (7)$$

$$= \Pr_{x,b}[h_x(m) - h_x(n) = \alpha - \beta \mid b = \alpha - h_x(m)] \Pr_{x,b}[b = \alpha - h_x(m)] \quad (8)$$

$$= 1/|R|^2 \quad (9)$$

The last equation follows since $h_x$ is a $\Delta$—universal hash function and $h_x(m) - h_x(n)$ can take on any value in R with equal probability.

The invention claimed is:

1. A method for producing a shortened representation of a collection of bits, comprising the steps of:

inputting the collection of "n" bits;

summing a key having at least "n" bits with the collection of bits to produce a sum;

squaring the sum to produce a squared sum;

performing a modular "p" operation on the squared sum, where "p" is at least as large as a first prime number greater than $2^n$ to produce a modular "p" result;

performing a modular $2^l$ operation on the modular "p" result to produce a modular $2^l$ result where, "l" is less than "n"; and outputting the modular $2^l$ result.

2. A method for producing a shortened representation of a collection of bits, comprising the steps of:

inputting the collection of "n" bits;

summing a first key having at least "n" bits with the collection of bits to produce a first sum;

squaring the first sum to produce a squared sum;

summing the squared sum with a second key having at least "n" bits to produce a second sum;

performing a modular "p" operation on the second sum, where "p" is at least as large as a first prime number greater than $2^n$ to produce a modular "p" result;

performing a modular $2^l$ operation on the modular "p" result to produce a modular $2^l$ result where, "l" is less than "n"; and outputting the modular $2^l$ result.

3. A method for producing a shortened representation of a collection of bits, comprising the steps of:

inputting a collection of "n" bits;

summing a key having at least "n" bits with the collection of bits to produce a sum;

squaring the sum to produce a squared sum;

repeating the previous three steps at least once to produce a plurality of squared sums, where a different key is used each time the steps are repeated;

summing the plurality of squared sums to produce a summation;

performing a modular "p" operation on the summation, where "p" is at least as large as a first prime number greater than $2^n$ to produce a modular "p" result;

performing a modular $2^l$ operation on the modular "p" result to produce a modular $2^l$ result where, "l" is less than "n"; and outputting the modular $2^l$ result.

* * * * *